US007039884B2

(12) United States Patent
Kitchin (10) Patent No.: US 7,039,884 B2
(45) Date of Patent: May 2, 2006

(54) METHOD OF EXTRACTING CIRCUIT TIMING PARAMETERS USING PICOSECOND-SCALE PHOTON TIMING MEASUREMENTS

(75) Inventor: John F. Kitchin, Shrewsbury, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 180 days.

(21) Appl. No.: 10/269,609

(22) Filed: Oct. 11, 2002

(65) Prior Publication Data

US 2004/0073875 A1    Apr. 15, 2004

(51) Int. Cl.
G06F 17/50 (2006.01)
(52) U.S. Cl. .......................................... 716/4; 382/151
(58) Field of Classification Search .................... 716/4; 382/151
See application file for complete search history.

(56) References Cited

U.S. PATENT DOCUMENTS

| | | | |
|---|---|---|---|
| 6,226,409 B1 | 5/2001 | Cham et al. | |
| 6,314,204 B1 | 11/2001 | Cham et al. | |
| 2003/0141879 A1* | 7/2003 | Wilsher | 324/601 |
| 2003/0156750 A1* | 8/2003 | Dajee et al. | 382/151 |

OTHER PUBLICATIONS

M. Hayat et al., Maximum-Likelihood Image Estimation Using Photon-Correlated Beams, IEEE Transactions on Image Processing, vol. 11, No. 8, pp. 838-846, Aug. 2002.*
M. McManus et al., Picosecond Imaging Circuit Analysis of ULSI Microprocessors, 2002 IEEE Microwave Symposium Digest, vol.: 3, pp. 1505-1508 Jun. 2002.*
John L. Stanford et al.,; "Statistical Methods for Physical Science" (Methods of Experimental Physics, vol. 28); Academic Press, Oct. 1994 (pp. 146-229).
Klaus E. Timmermann et al.; "Multiscale Modeling and Estimation of Poisson Process with Application to Photon-Limited Imaging"; IEEE Transactions on Information Theory, vol. 45, No. 3, Apr. 1999 (pp. 846-862).
Travis Eiles et al.; "Optical Probing of Flip-Chip-Packaged Microproc ssors"; ISSCC 2000/Session 13/TD: Low-Temp. Circuits & Diagnostic Techniques/Paper TP 13.4; 2000 IEEE International Solid-State Circuits Conference, Feb. 8, 2000 (pp. 220-221).
J. C. Tang et al.; "Picoseond Imaging Circuit Analysis"; IBM J. Res. Develop. vol. 44, No. 4, Jul. 2000 (pp. 583-603).
Ted Lindquist et al.; "Characterize Gate-Level Transistor Performance with PICA"; Semiconductor International, Jul. 2001 (4 p.).

* cited by examiner

Primary Examiner—A. M. Thompson (57) ABSTRACT

A method of extracting circuit parameters from picosecond-scale photon timing measurements is disclosed. In one embodiment, the method is implemented by a system that comprises a photomultiplier, a data acquirer, and a processing module. The photomultiplier detects photons emitted from current-carrying channels in an integrated circuit, and associates a detection position and a detection time with each detected photon. The data acquirer receives position and time signals from the photomultiplier, and further receives a trigger signal. The data acquirer determines a relative detection time for each photon by combining the time and trigger signals. The data acquirer gradually compiles the photon detection data and makes it available to the processing module. The processing module responsively determines optimal values for a parameterized model of the data. The model is preferably based on non-homogeneous Poisson process statistics, and may employ a maximum likelihood approach to estimating the optimal values.

21 Claims, 3 Drawing Sheets

METHOD OF EXTRACTING CIRCUIT TIMING PARAMETERS USING PICOSECOND-SCALE PHOTON TIMING MEASUREMENTS

BACKGROUND

Figures 1, 2:
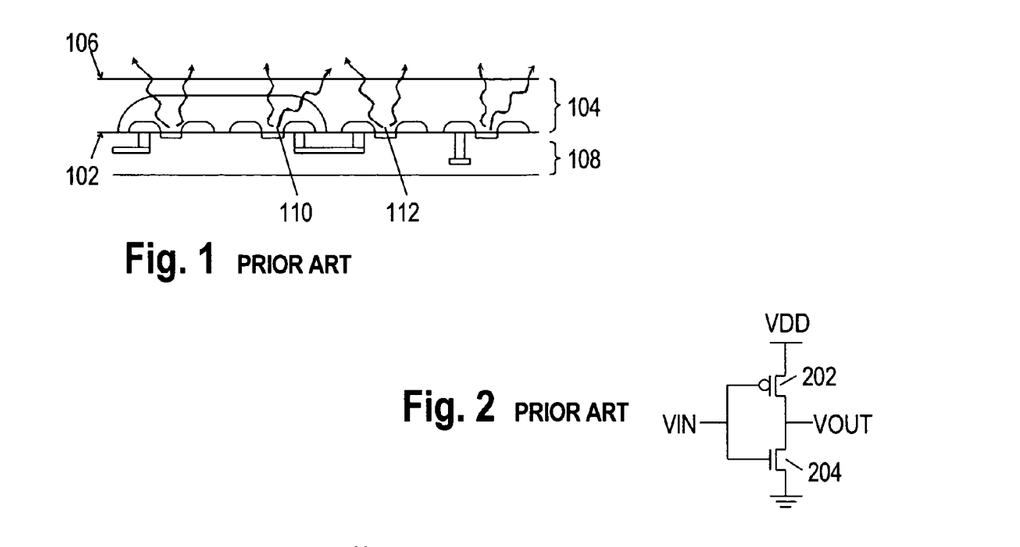
FIG. 1 shows an illustrative integrated circuit device.
FIG. 2 shows a schematic of a CMOS inverter.

FIG. 1 shows an illustrative cross-section of an integrated circuit (not to scale). An integrated circuit is typically fabricated on the "front" side 102 of a silicon wafer 104. The integrated circuit is formed in stages, beginning with the careful introduction of impurities into localized regions of the silicon. The regions of impure ("doped") silicon are termed "wells". Small, heavily-doped wells are used as connection terminals of individual integrated device structures. The structure of a metal-oxide-semiconductor field effect transistor (MOSFET) includes two closely-spaced wells, with a conductive (often metallic) "gate" layer deposited on the front side 106 of the wafer 104 between the wells. (A thin oxide layer separates the gate from the silicon, hence the description "metal-oxide-semiconductor"). The conductivity of the silicon between the closely-spaced wells (the "channel") can be changed by applying a voltage to the gate; this provides the controlled switching behavior that allows the device to operate as a transistor.

Once the transistors and other circuit components have been formed, a series of layers 108 are added to interconnect the circuit components. These layers include conductors that "wire" the components together, and insulation that protects and separates the conductors. The conductive materials in the layers 108 are opaque, but it has been discovered that the integrated circuit can be studied from the "back" side 106 of the wafer 104. Material may be ground away from the back side 106 to thin the wafer 104, thereby increasing its transparency.

Integrated circuits have microscopic dimensions, which make them difficult to test and characterize. Tsang, Kash, and Vallett present a new technique for measuring integrated circuit parameters in "Picosecond imaging circuit analysis," *IBM J Res. Develop.*, Vol. 44, No. 4, July 2000, which is hereby incorporated by reference. Some applications of what Tsang, et al, call their "PICA" technique are outlined by Lundquist and McManus in "Characterize gate-level transistor performance with PICA," *Semiconductor International*, July 2001, which is also incorporated herein by reference. Among these applications are the measurement of propagation delays and relative timing parameters in circuits. Such applications may prove invaluable in quick pinpointing of the precise nature and location of faults.

The PICA technique relies on a combination of physical phenomena that are present in modem digital circuits. First, the MOSFETs employed in digital circuits typically operate in the saturation region of their current-voltage curves when "ON". In this region, very high electric fields exist in the channel. Charge carriers (i.e., electrons and holes) can quickly gain a significant amount of kinetic energy in such electric fields, and indeed, many "hot" carriers are generated in this manner when current flows through the channel. A variety of scattering and recombination mechanisms may strip the energy from "hot" carriers, and in so doing, may trigger the emission of a photon of light. The light is emitted over a wide range of frequencies, but the infrared band of the spectrum is particularly significant because silicon is relatively transparent there.

The upshot is that current-carrying transistors in modem digital circuits emit infrared light. FIG. 1 represents the emission of infrared light as wavy lines originating from the transistor channels 110, 112.

One of the key factors to the success of highly integrated digital circuits is the use of complementary metal-oxide-semiconductor (CMOS) technology. CMOS technology consumes a dramatically smaller amount of current (and hence power) than other transistor technologies. The reduction in current is a consequence of pairing p-type MOSFETs with n-type MOSFETs, so that one of the transistors is "OFF" when the other is "ON".

See, for example, FIG. 2, which shows a CMOS inverter. When the input voltage VIN is high (close to the supply voltage VDD), this puts the p-type MOSFET 202 in the "OFF" state, and puts the n-type MOSFET 204 in the "ON" state. The output voltage VOUT is pulled low (close to ground). Conversely, when VIN is low, transistor 202 is "ON" and transistor 204 is "OFF", causing VOUT to be pulled high. Except briefly in the midst of VIN transitions between high and low voltages, one of the transistors is always "OFF", so there is no steady-state current consumption. Only during transitions between states does any current flow occur. Because current flow is indicative of a switching transition, and because infrared light emission is indicative of current flow, we can use photon detection to measure the timing parameters of switching in digital circuits.

However, accurate extraction of timing parameters from PICA measurements is not straightforward. Photon emission is a statistical process, and it is expected that the probability of detected photon emission for current VLSI technology is on the order of $10^{-9}$ infrared photons per switching event per micron of channel width. To get a statistically useful measurement, many switching events must be generated, and the timing of the separately detected photons must be correlated with a repeatable trigger. The relative timing of the photons can be plotted as a histogram, and the peak of the histogram may be used to determine the timing of the transistor's switching transition relative to the trigger. Unfortunately, the histograms are "noisy" as a result of the granularity of the events (i.e., either a photon is detected, or it is not detected) and the rarity of events. The noise makes the measurements difficult to interpret. The histograms gradually approach a smooth curve if the measurements are taken over a sufficiently long period of time, but this is not expected to be feasible for small width devices or devices that switch infrequently relative to the clock frequency. Accordingly, an objective method of extracting circuit parameters from picosecond-scale photon timing measurements is desirable.

SUMMARY

Accordingly, an objective method of extracting circuit parameters from picosecond scale photon timing measurements is disclosed herein. In one embodiment, the method is implemented by a system that comprises an imaging photomultiplier, a data acquirer, and a processing module. The imaging photomultiplier detects photons emitted from current-carrying channels in an integrated circuit, and associates a detection position and a detection time with each detected photon. The data acquirer receives position and time signals from the imaging photomultiplier, and further receives a trigger signal. The data acquirer determines a relative detection time for each photon by combining the time and trigger signals. The data acquirer gradually compiles the photon detection data and makes it available to the processing module. The processing module receives data indicative of a photon intensity profile, and responsively determines optimal values for a parameterized model of the data. The model is preferably based on non-homogeneous Poisson process statistics, and may employ a maximum likelihood approach to estimating the optimal values. The intensity function may be modeled using one or more triangular peaks with a constant for background intensity, and timing jitter can be accounted for. Other intensity function models may alternatively be employed.

BRIEF DESCRIPTION OF THE DRAWINGS

A better understanding of the present invention can be obtained when the following detailed description is considered in conjunction with the following drawings, in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 3:
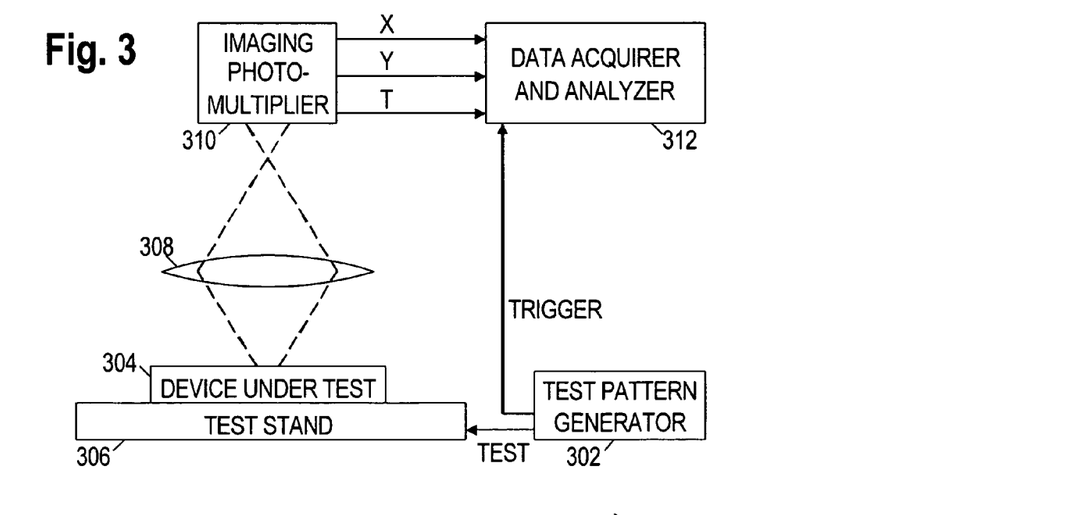
FIG. 3 shows an exemplary picosecond-scale photon detection system.

FIG. 3 shows an illustrative functional block diagram of an apparatus for making picosecond-scale photon timing measurements. The apparatus includes a test pattern generator 302 which generates a sequence of input signal vectors ("test vectors") that are designed to make the integrated circuit operate in the desired manner. The desired operation depends on the circumstances. For example, when a fault has been detected in the circuit under certain operating conditions, the test pattern generator may be programmed to duplicate those operating conditions. When it is desired to measure a propagation delay between circuit components, the test vectors may be designed to repeatedly cause transitions in those components.

The test pattern generator 302 provides the test vectors to the device under test 304, which is supported in a test stand 306. The test stand 306 accepts input signals from the test pattern generator 302, and provides the input signals to the device under test 304 along with power and any other needed signals (e.g. clock signals, bias voltages, etc.). The test stand 306 may also accept output signals from device 304 and provide them to another functional block.

It is expected that device 304 will typically be fully packaged integrated circuit chip which has been modified to make the back side of the silicon wafer viewable. In addition the wafer may have been thinned to increase the transparency of the wafer to infrared light.

As the device 304 operates, currents flow through various components, and in particular, through metal-oxide-semiconductor field effect transistors (MOSFETs) undergoing switching transitions. The current-carrying components emit photons of infrared light that pass through the wafer and radiate from the back side. A microscope lens 308 captures and redirects the photons into an imaging photomultiplier 310.

Photomultiplier 310 performs two functions: amplification and measurement. A single photon impacting on the photomultiplier 310 knocks an electron free from a surface. The photomultiplier amplifies the effect of the freed electron to create a cascade of electrons that form a detectable current pulse. The photomultiplier 310 also measures the position of the incident photon in an image grid by determining where the current pulse was detected. The image grid may be divided into 512 or more rows and 512 or more columns. Photomultiplier 310 preferably provides an X signal indicating the row, and a Y signal indicating the column in which the photon is detected. In addition, the transient current pulse is preferably conditioned to form a T signal that indicates the time when the photon is detected, to within picosecond-scale resolution. These signals may or may not be in digital form.

The final functional block of the measurement apparatus is the Data Acquirer and Analyzer (DAA) 312. The DAA receives the X, Y, and T signals from the imaging photomultiplier 310, and receives a trigger signal from the test pattern generator 302. The trigger signal may alternatively be provided from the device under test 304 and/or the test stand 306. The trigger signal is a reference signal, and typically it is correlated with the switching event(s) being measured on device 304. The DAA 312 measures the T signal relative to the trigger signal. If the signals are digital, the DAA 312 calculates a difference between the T signal and the trigger signal. If the signals are not digital, it determines the photon detection time by measuring an interval between a transition of the trigger signal and a transition of the T signal. This relative time value is hereafter denoted "R".

If the X and Y and R values are not in digital form, the DAA 312 preferably converts them to digital form. The DAA 312 then preferably stores the (X,Y,R) triplets for later analysis, although in an alternative embodiment, the DAA 312 constructs a histogram and then discards the triplets. The histogram is a three dimensional array of possible (X,Y,R) triplets, in which a count is associated with each of the values. When a particular (X,Y,R) triplet is received, the count associated with that triplet is incremented. Note that histogram is not necessarily stored in the form of a three dimensional array, but may alternatively be represented by a more compact data structure.

The data collection performed by the DAA 312 may be divided into sessions. At the beginning of a session, a new data file is created and/or the histogram is initialized with zeros. Data collection then commences and continues until the session is temporarily suspended or is ended. At the end of a session, the data collection is halted and the data file and/or histogram is exported or stored in long term storage.

The data can then be analyzed in a variety of ways by DAA 312 or by some external system.

Figure 4:
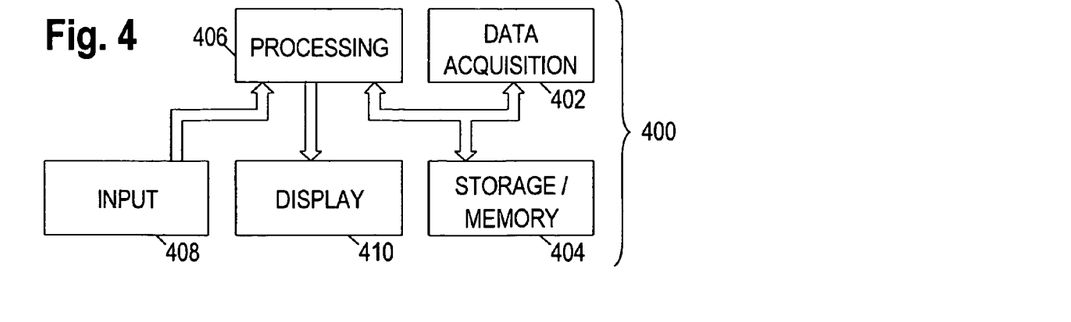
FIG. 4 shows an exemplary functional block diagram of an apparatus for analyzing photon detection data.

FIG. 4 shows an illustrative functional block diagram of a system 400 for analyzing data obtained by the apparatus of FIG. 3. The system 400 may be contained within DAA 312, or alternatively, it may be an external system coupled to DAA 312. In yet another embodiment, it is an entirely separate system to which the data from DAA 312 is transported.

System 400 includes a module 402 which receives the photon measurement data. Module 402 may simply be a port through which the data enters the system, or it may be a more complex module for conditioning and acquiring data signals. The data is stored in a storage module 404, which maintains a copy of the data for access by the processing module 406. Storage module may take the form of dynamic random access memory (DRAM), static random access memory (SRAM), Flash ROM (read only memory), optical storage media, magnetic storage media, or any combination thereof. Note that storage module 404 (or a portion thereof) may be removable so as to be portable between systems. Storage module 404 may further maintain a copy of software for analyzing the data as described further below.

Processing module 406 accepts instructions from a user via input module 408, and responsively operates on the data from storage module 404 to extract circuit timing parameters. The data and/or parameters may be displayed in some form to the user by display module 410.

Figure 5:
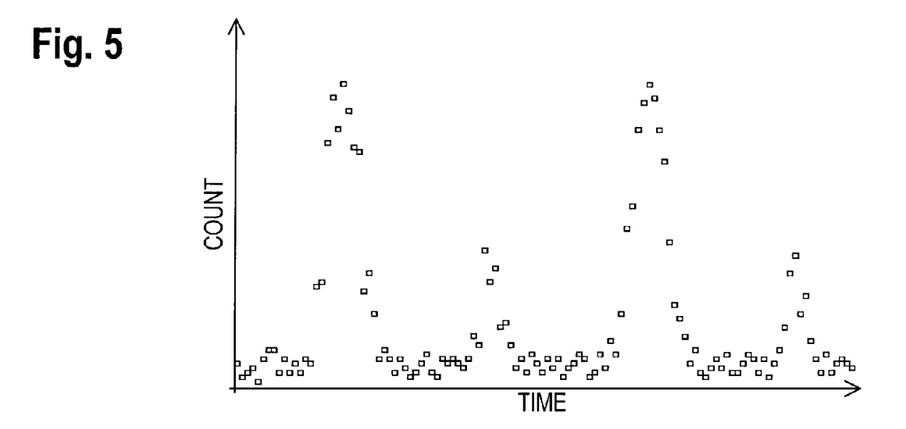
FIG. 5 shows a hypothetical graph of photon detection data.

The photon detection data (or a subset thereof) may be displayed in a variety of forms. Of particular utility to the present application is form shown in FIG. 5. In FIG. 5, the number of photons detected at a given pixel or at a given set of pixel is plotted as a function of relative time. The time axis is divided into intervals, and the data shows the number of photons detected in each interval. Of particular interest is the precise interval between peaks, although other parameters may also be of interest, such as relative amplitude, peak width, and rise and fall times.

Although a variety of heuristic techniques may be used to estimate these values, a preferred method of extracting these parameters involves Maximum Likelihood Estimation (MLE). MLE is appealing for a number of reasons. The parameters estimates obtained using MLE are asymptotically consistent, i.e., they converge to a determinable value as the sample size increases. The parameters estimates are also asymptotically unbiased, i.e. the determinable value is the true value of the parameters. Further, the variance of the parameter estimates approaches the theoretical minimum for all possible estimation methods for large sample sizes. In addition, the MLE estimates are asymptotically fully efficient, i.e. the mean square error of the estimates approach the theoretical minimum for large sample sizes. Still further, the estimates, when normalized, follow (approximately) a multivariate normal distribution, which allows for construction of approximate confidence bounds. Finally, the estimation equations are generally well-behaved and amenable to solution by numerical means.

The MLE approach involves first defining a parameterized model, then constructing a likelihood equation for the model, and finally determining the parameters that maximize the likelihood equation for a given data set.

Model for Photon Arrival Times (Without Jitter)

Consider an imaging session where photons are detected over some set S of pixels. As relative time evolves from the triggered start time $T_{start}=0$ to stop time $T_{stop}$, photons are generated quantum-mechanically by hot carriers in the channel(s) imaged by pixel set S. Let $0<X_1<X_2< \ldots <X_r<T_{stop}$ be the true sequence of successive arrival times for the photons so generated that happen to impact the photomultiplier and are successfully detected. "True" here means the arrival times before time jitter is taken into account. (Time jitter is considered in a separate model.)

Let N(t,t+h) denote the number of these arrival times in the interval (t,t+h] for $t \geq 0$ and h>0. Photons in our apparatus are generated by quantum-mechanical events and are relatively rare (~1 detected per 1 billion switching events per um of NMOS transistor width for 0.18 um bulk CMOS at 1.65V). Available single photon imaging cameras can have a detection deadtime of 10 μsec or less, so the fraction of potentially detectable photons that are lost due to deadtime is negligible except when imaging very wide devices (>10 mm). Thus, it is reasonable to assume that the point process described by N(t,t+h) satisfies the postulates for a Non-Homogeneous Poisson Process (NHPP):

$$Pr\{N(t,t+h)=0\}=1-\lambda(t)h+o(h), \text{ and} \quad (1)$$

$$Pr\{N(t,t+h)=1\}=\lambda(t)h+o(h) \text{ as } h \to 0 \quad (2)$$

where $\lambda(t)>0$ is the intensity function of the process and $o(h)/h \to 0$ as $h \to 0$. For our purposes, o(h) is set to zero, and $\lambda(t)$ represents the photon intensity at the detector. It is the modeling and analysis of the intensity function that is of interest, as it reflects the current flow through the imaged channel(s).

Figure 6:
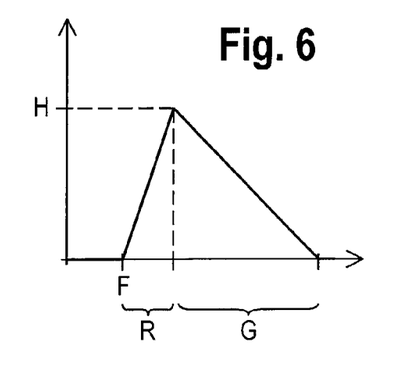
FIG. 6 shows one parameterized model of a triangular intensity peak.

The photon intensity $\lambda(t)$ varies as a function of time. This is evident from the data in FIG. 5. FIG. 6 shows a parsimonious model of the intensity function that includes as parameters the values of interest: start time f, rise time r, height h, and fall time g. The simplest model having these four parameters is a scalene triangle. The triangular model $\gamma(t)$ can be expressed in the following way:

$$\gamma(s; 0, r, h, g) = \frac{h}{rg}(gs \cdot \delta(r-s, s) + \quad (3)$$
$$r(r+g-s) \cdot \delta(r+g-s, s-r))$$
$$\gamma(s; f, r, h, g) = \gamma(s-f; 0, r, h, g)$$

where $\delta(x,y)$ is a function that equals one when both arguments are greater than or equal to zero, and that equals zero otherwise. There is a background photon arrival rate evident in FIG. 5 (due to noise in the detector) which can modeled as a constant intensity $\alpha$ over a fixed interval of observation (a,b]. The combined intensity function is then:

$$\lambda(t) = \alpha \cdot \delta(t-a, b-t) + \sum_{i=1}^{m} \gamma(t; f_i, r_i, h_i, g_i) \quad (4)$$

where m is the number of switching events observed in the timing window by the set of pixels S. For example, in FIG. 5, there are four switching events. Some of the parameters may be assumed to be equal, e.g. in FIG. 5, it might be assumed that $r_3=r_1$, $r_4=r_2$, $h_3=h_1$, $h_4=h_2$, $g^3=g_1$, and $g_4=g_2$. Such assumptions would provide a more parsimonious model for parameter extraction and simplify the confidence interval determination process.

In general for a NHPP, the probability of having r photons detected within a given time interval (s,t] is:

$$\Pr[N(s, t) = r] = \exp(-[\mu(t) - \mu(s)])\frac{[\mu(t) - \mu(s)]^r}{r!}, r = 0,1,\ldots \quad (5)$$

where $$\mu(s) = \int_{-\infty}^{s} \lambda(x)dx.$$

is the cumulative intensity function of the NHPP. If a sample of arrival times $x_1, x_2, \ldots, x_n$ is observed over the interval (a,b] in a particular PICA imaging session, the likelihood function A for this sample is given by:

$$\Lambda(x_1, \ldots, x_n; \lambda(x)) = \exp\left(-\int_a^b \lambda(u)du\right)\prod_{i=1}^{n} \lambda(x_i). \quad (6)$$

Refer to explanation starting on p. 495 of Lawless, J. F., *Statistical Models and Methods for Lifetime Data*, John Wiley & Sons, New York, 1982, which is hereby incorporated by reference.

However, where the data is reported in the preferred form, the sample of recorded arrival times $x_1, x_2, \ldots, x_n$, is reported as histogram, i.e., a sequence of photon counts $c_1, c_2, \ldots, c_k$ over a sequence of k successive time bins covering a time interval (a,b]. (The preferred apparatus is designed to support time bins down to 2.5 ps wide.) For any partition of the time interval (a,b], say $a=\alpha_0<\alpha_1<\ldots<\alpha_n=b$, the likelihood of observing $c_1$ photons in $(\alpha_0,\alpha_1]$, $c_2$ photons in $(\alpha_1,\alpha_2], \ldots, c_n$ photons in $(\alpha_{n-1},\alpha_n]$, is given by:

$$\Lambda(c_1, \ldots, c_n; \lambda(s)) = \exp(-[\mu(b) - \mu(a)])\prod_{i=1}^{n} \frac{[\mu(a_i) - \mu(a_{i-1})]^{c_i}}{c_i!} \quad (7)$$

where $$\mu(s) = \int_{-\infty}^{s} \lambda(x)dx.$$

Though in practical situations there is a known, finite time interval (a,b] outside of which $\lambda(t)=0$ and there is zero probability of observing an arrival time, equations (6) and (7) above hold true even if the time interval (a,b] is expanded to $(-\infty,\infty)$, so long as $$\int_a^b \lambda(x)dx$$

remains finite.

Note that the likelihood equation is a function of the intensity function, which in turn is a function of the parameters $\alpha$ and $f_i, r_i, h_i, g_i$, i=1 . . . m. The MLE approach estimates these parameters by determining which parameter values maximize the likelihood function. A variety of numerical maximization techniques are known and may be used to identify these parameter values, typically by (equivalently) minimizing the negative of the logarithm of the likelihood function (NLL).

A preferred numerical technique for minimizing the NLL is known as a Line Search Method. In this method a descent direction (in the multiple dimension space that contains the parameter values sought) is determined on each iteration so that the next iterate (vector of parameter values) is chosen to be a point in this descent direction that decreases the NLL. Many implementations of this method can utilize the Hessian (matrix of second derivatives with respect to the vector of parameters) of the NLL. A closed form for the Hessian can be computed for the NLL corresponding to Equation 7 above. Line search methods typically have good convergence properties even when the starting values given for the parameters are not close to the ultimate parameter values that minimize the NLL (the MLE parameter values).

Figure 7:
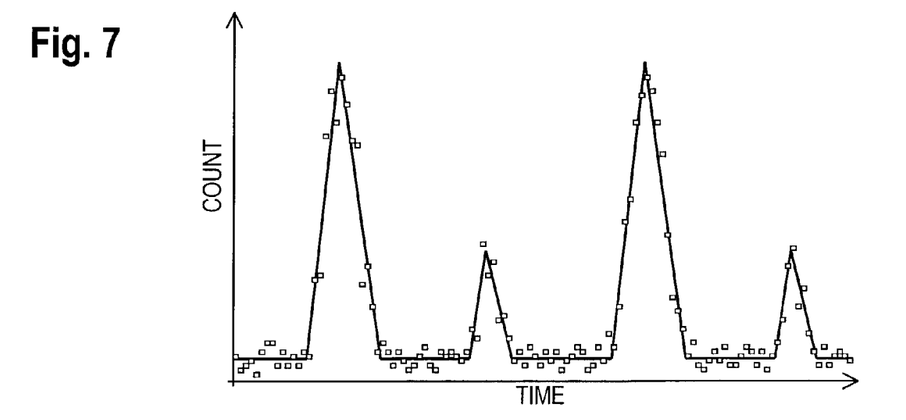
FIG. 7 shows a hypothetical graph of a maximum likelihood estimate of a triangular intensity function with a constant background intensity for the photon detection data.

In any event, once the MLE parameters have been calculated, the intensity function can then be plotted as shown in FIG. 7. The parameter values may also be used to determine propagation delay, duty cycle, clock skew, and timing jitter. As just one example, if each peak in FIG. 7 is from a different transistor, and the time between the first and third peaks is solely due to signal propagation delay, the propagation delay can be determined as $f_3-f_1$ (or if peak-to-peak delay is preferred, $f_3+r_3-f_1-r_1$).

Model for Photon Arrival Times (With Jitter)

The above analysis has been performed without considering the effects of timing jitter. In fact, jitter is an important consideration since the data measurement is taken over a "wall-clock" time interval of several hours or more. Time measurements made on the picosecond scale, even though they are made in relative time, are nevertheless sensitive to jitter.

The measured photon arrival times may be subject to jitter contributed by several sources including: the photon detection process, the timing measurement electronics, the trigger signal, the on-chip clocking signal, and switching fluctuations due to variations in the power supply voltage. For the true photon arrival times $X_1, X_2, \ldots, X_r$, assume the totality of time jitter affecting them is captured by the sequence of independent (of each other and of the $X_i$'s) random jitter times $Z_1, Z_2, \ldots, Z_r$, with a common Gaussian distribution given by:

$$\Pr\{Z_i \leq t\} = \int_{-\infty}^{t} \sigma^{-1}\varphi(x/\sigma)dx = \Phi(t/\sigma), \quad (8)$$

where $$\varphi(x) = \frac{1}{\sqrt{2\pi}}e^{-x^2/2}. \quad (9)$$

In this model what is actually recorded as arrival times are the times $T_i = X_i + Z_i$, i=1, . . . , r.

For simplicity, let us initially assume that the jittered arrival times are observed over the interval $(-\infty,\infty)$. In particular, assume that an arrival time near zero that receives a negative jitter component can be observed even though it may be less than zero. Then by Theorem 1 (derived in the Appendix) the likelihood function for a sample of jittered arrival times $t_1, t_2, \ldots, t_n$, in the interval $(-\infty, \infty)$ is given by:

$$\Lambda(t_1, \ldots, t_n; \lambda(t), \sigma) = \exp\left(-\int_{-\infty}^{\infty} \lambda(t) dt\right) \prod_{i=1}^{n} \lambda(t_i, \sigma), \quad (10)$$

where the "jittered" intensity function is given by the convolution of the original intensity function with the Gaussian pulse:

$$\lambda(s, \sigma) = \int_{-\infty}^{\infty} \lambda(s-z) \sigma^{-1} \varphi(z/\sigma) dz. \quad (11)$$

The likelihood function in equation (10) is equivalent to the likelihood function that would result from directly assuming a NHPP model with intensity function $\lambda(s, \sigma)$ with respect to the recorded photon arrival times $T_i$, if it can be shown that the intensity function integrals are equal. The proof is as follows:

$$\int_{s=-\infty}^{\infty} \lambda(s, \sigma) ds = \int_{s=-\infty}^{\infty} \int_{z=-\infty}^{\infty} \lambda(s-z) \sigma^{-1} \varphi(z/\sigma) dz \, ds \quad (12)$$

$$= \int_{z=-\infty}^{\infty} \left(\int_{s=-\infty}^{\infty} \lambda(s) ds\right) \sigma^{-1} \varphi(z/\sigma) dz$$

$$= \int_{s=-\infty}^{\infty} \lambda(s) ds$$

where the limit interchange is allowed since $$\int_{-\infty}^{\infty} \lambda(s) ds$$

is assumed to be finite.

As before, the likelihood function can be restated for data reported in the histogram format:

$$\Lambda(c_1, \ldots, c_n; \lambda(s), \sigma) = \quad (13)$$

$$\exp(-[\mu_\sigma(b) - \mu_\sigma(a)]) \prod_{i=1}^{n} \frac{[\mu_\sigma(a_i) - \mu_\sigma(a_{i-1})]^{c_i}}{c_i!},$$

where $$\mu_\sigma(s) = \int_{-\infty}^{s} \lambda(x, \sigma) dx.$$

This cumulative photon intensity function can be stated in the following form (for a single peak, ignoring the constant background rate for the present):

$$\mu_\sigma(s; 0, r, h, g) = \int_{-\infty}^{s} \int_{-\infty}^{\infty} \lambda(s-z; 0, r, h, g) \sigma^{-1} \varphi\left(\frac{z}{\sigma}\right) dz \, dx \quad (14)$$

$$= \frac{h}{2rg} g s \sigma \varphi\left(\frac{s}{\varphi}\right) - (r+g)(s-r) \sigma \varphi\left(\frac{s-r}{\sigma}\right) + \quad (15)$$

$$r(s - (r+g)) \sigma \varphi\left(\frac{s-(r+g)}{\sigma}\right) +$$

$$g(s^2 + \sigma^2) \Phi\left(\frac{s}{\sigma}\right) - (r+g)((s-r)^2 + \sigma^2) \Phi\left(\frac{s-r}{\sigma}\right) +$$

$$r((s-(r+g))^2 + \sigma^2) \Phi\left(\frac{s-(r+g)}{\sigma}\right)$$

$$\mu_\sigma(s; f, r, h, g) = \mu_\sigma(s-f; 0, r, h, g) \quad (16)$$

The complete cumulative photon intensity function with jitter, for multiple peaks and a constant background rate a over (a,b] is:

$$\mu_\sigma(s) = \alpha \left(\sigma \varphi\left(\frac{s-a}{\sigma}\right) - \sigma \varphi\left(\frac{b-s}{\sigma}\right) + (b-s) \Phi\left(\frac{s-b}{\sigma}\right) + \quad (17)$$

$$(s-a) \Phi\left(\frac{s-a}{\sigma}\right)\right) + \sum_{i=1 \ldots m} \mu_\sigma(s; f_i, r_i, h_i, g_i)$$

Figure 8:
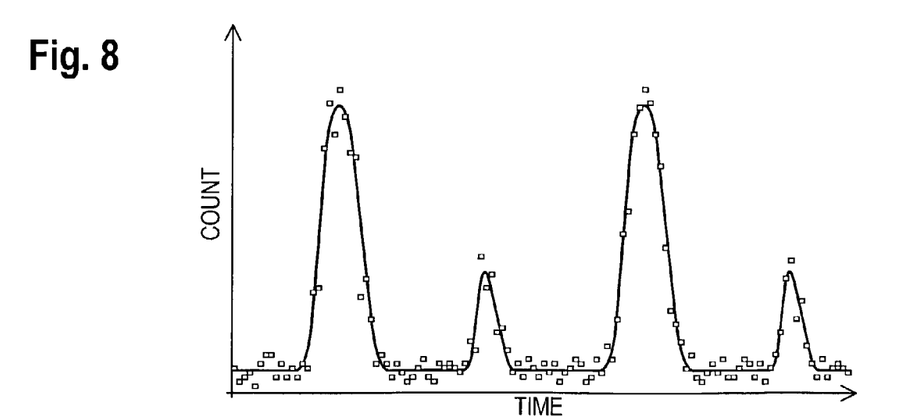
FIG. 8 shows a hypothetical graph of a maximum likelihood estimate of a time-jittered triangular intensity function with a constant background intensity for the photon detection data.

Accounting for jitter adds one parameter to the model (standard deviation a), so for the triangular intensity function model with jitter, the parameter list is $\alpha$, $\sigma$, $f_i, r_i, h_i, g_i$, $i=1 \ldots m$. (As before, we assume that the number of peaks m is determinable from visual inspection or some other source). The parameter values that maximize the likelihood function are calculated as before, and the jittered intensity function is plotted in FIG. 8.

Likelihood equation (13) applies, and a numerical maximization method may be employed to extract the parameters.

Confidence Interval Determination

In the following, we denote the set of parameters as a vector $\theta$, and the set of MLE estimates of the parameter values as $\hat{\theta}$. Once the MLE estimates $\hat{\theta}$ have been found, a confidence interval (or region) can be determined for any subset of the parameters $\theta_1$, where $\theta$ is expressible as $(\theta_1, \theta_2)$. While various ways exist, a convenient approximation of the confidence interval can be calculated from the profile likelihood. Ignoring for the moment the likelihood function's dependence on the data, and focusing on the dependence on the parameters $\theta = (\theta_1, \theta_2)$, the profile likelihood of a given parameter subset $\theta_1$ is defined as:

$$R(\theta_1) = \max_{\theta_2} \left[\frac{\Lambda((\theta_1, \theta_2))}{\Lambda(\hat{\theta})}\right] \quad (18)$$

The approximate $100(1-\epsilon)\%$ confidence region for the given parameter subset $\theta_1$ is the set of all values of $\theta_1$ such that:

$$R(\theta_1) > \exp(-\chi^2_{(1-\epsilon, k)}/2) \quad (19)$$

where $\chi^2_{(1-\epsilon,k)}$ denotes the $100(1-\epsilon)\%$ quantile of a Chi-square distribution with k degrees of freedom, where k is the number of parameters in subset $\theta_1$.

Another feature of MLE that is put to use in this approach is the determination of a confidence interval for a function of the parameters. Where $g(\theta)=\beta$ is one-to-one transformation of $\theta$ into a new parameter set $\beta$ and $g(\theta)$ has continuous first partial derivatives with respect to $\theta$, then the MLE of $\hat{\beta}=g(\hat{\theta})$. Moreover, the inverse relation $g^{-1}[\beta]=\theta$ holds and $$R(\beta_1) = \max_{\beta_2}\left[\frac{\Lambda(g^{-1}[(\beta_1,\beta_2)])}{\Lambda(\hat{\theta})}\right] \quad (20)$$

for any subset of parameters $\beta_1$, where $\beta=(\beta_1, \beta_2)$.

As just one example, consider (for simplicity) modeling only the first two peaks in FIG. 7 with parameters $\theta=<f_1, r_1, h_1, g_1, f_2, r_2, h_2, g_2, \alpha, \sigma>$ and seeking to estimate the peak-to-peak delay. Define the one-to-one transformation g as post multiplication by the full-rank matrix $$A = \begin{bmatrix} -1 & 1 & 1 & 0 & 0 & 0 & 0 & 0 & 0 & 0 \\ -1 & 0 & 1 & 0 & 0 & 0 & 0 & 0 & 0 & 0 \\ 0 & 0 & 0 & 1 & 0 & 0 & 0 & 0 & 0 & 0 \\ 0 & 0 & 0 & 0 & 1 & 0 & 0 & 0 & 0 & 0 \\ 1 & 0 & 0 & 0 & 0 & 0 & 0 & 0 & 0 & 0 \\ 1 & 0 & 0 & 0 & 0 & 1 & 0 & 0 & 0 & 0 \\ 0 & 0 & 0 & 0 & 0 & 0 & 1 & 0 & 0 & 0 \\ 0 & 0 & 0 & 0 & 0 & 0 & 0 & 1 & 0 & 0 \\ 0 & 0 & 0 & 0 & 0 & 0 & 0 & 0 & 1 & 0 \\ 0 & 0 & 0 & 0 & 0 & 0 & 0 & 0 & 0 & 1 \end{bmatrix} \quad (21)$$

so that $\beta=g(\theta)=\theta\cdot A=(\beta_1,\beta_2)$, with $$\beta_1=<f_2+r_2-f_1-r_1> \text{ and } \beta_2=<f_1,f_1+r_1h_1,g_1,r_2,h_2,g_2,\alpha,\sigma> \quad (22)$$

Then $$R(\beta_1)>\exp(-\chi_{(1-\epsilon,1)}^2/2) \quad (23)$$

defines an approximate $100(1-\epsilon)\%$ confidence interval for the peak-to-peak delay $f_2+r_2-f_1-r_1$.

Extraction Method

Figure 9:
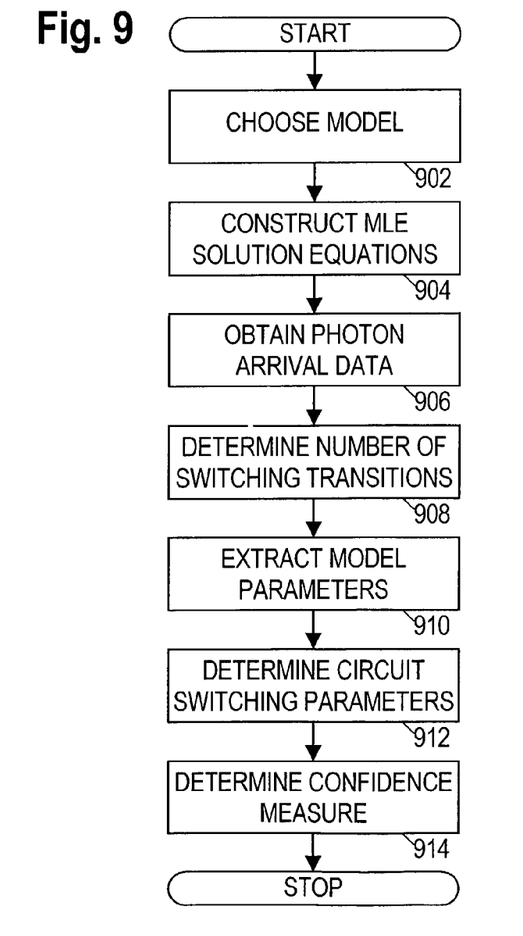
FIG. 9 shows a flowchart of a preferred method of extracting circuit parameters from photon detection data.

Turning now to FIG. 9, the preferred parameter extraction method is summarized in the form of a flowchart. The software executed by processing module 406 preferably performs most, but not necessarily all, of the actions in this flowchart. In block 902, a parameterized intensity function model is chosen. A wide number of models may be chosen, but the preferred models include the triangular model over a constant background intensity, with and without jitter. In block 904, the likelihood equations for the model are constructed, and a solution procedure is incorporated into the program code. In block 906, the photon arrival data is obtained. Initial processing may be performed on the data, e.g., to determine an average number of background noise counts and to remove these from the data.

In block 908, the number of switching transition peaks is determined. There are a number of ways this may be accomplished. In one approach, the photon arrival data is displayed to a user, who visually determines the number of peaks in the data. In a second approach, the processing module 406 executes a peak-finding algorithm to determine the number of peaks in the data. In a third approach, the user determines an expected number of peaks from knowledge of the imaged area of the integrated circuit and knowledge of the test pattern. Other approaches are possible and may be used.

In block 910, extracts values for the model parameters from the photon arrival data. This is accomplished by using the solution routine created in block 904. In block 912, the desired circuit switching parameters are then determined using the model parameters and the model.

Among the potential advantages that may be realized by the disclosed systems and methods are the potential for automation. The reliance on user interaction can be minimized, even to the point where the user merely powers-up the system. Further, the disclosed systems and methods can be applied to identify parameters of faint signals and/or signals that are acquired over a relatively short time.

Numerous variations and modifications will become apparent to those skilled in the art once the above disclosure is fully appreciated. It is intended that the following claims be interpreted to embrace all such variations and modifications.

APPENDIX

Theorem 1: Let $t_1,t_2,\ldots,t_n$ be a sample of photon arrival times observed over the interval $(-\infty,\infty)$ from an underl;ying NHPP with intensity function $\lambda(t)$ that has undergone $N(0,\sigma)$ time jitter. If there exists a finite bound M such that $$\lambda(t) \leq M \text{ for all } t \in (-\infty,\infty) \text{ and}$$

$$\int_{-\infty}^{\infty} \lambda(u)du \leq M,$$

then the Likelihood function $\Lambda$ for the photon arrival times is given by $$\Lambda(t_1,\ldots,t_n;\lambda(s),\sigma) = \exp\left(-\int_{-\infty}^{\infty}\lambda(u)du\right)\prod_{i=1}^{n}\lambda(t_i,\sigma),$$

where $\lambda(s,\sigma) = \int_{-\infty}^{\infty}\lambda(s-z)\sigma^{-1}\varphi\left(\frac{z}{\sigma}\right)dz$.

Proof: For brievity of notation let $$f(z) = \sigma^{-1}\varphi\left(\frac{z}{\sigma}\right).$$

Now, by definition of a Likelihood function for continuous random variables, $$\Lambda(t_1,\ldots,t_n;\lambda(t),\sigma) = \lim_{\epsilon\to 0}\Pr\{|T_i - t_i| < \epsilon, i = 1,\ldots,n\}\cdot(2\epsilon)^{-n}.$$

By the definition of the $T_i$'s, we have $$\Lambda(t_1,\ldots,t_n;\lambda(t),\sigma) = \lim_{\epsilon\to 0}\Pr\{|X_i + Z_i - t_i| < \epsilon, i = 1,\ldots,n\}\cdot(2\epsilon)^{-n}.$$

By the definition of condition probability, we have $$\Lambda = \lim_{\varepsilon \to 0}$$

$$\int_{-\infty}^{\infty} \cdots \int_{-\infty}^{\infty} \Pr\{|X_1 + z_1 - t_1| < \varepsilon, \ldots, |X_n + z_n - t_n| < \varepsilon \,|\, Z_1 = z_1, \ldots,$$

$$Z_n = z_n\} f(z_1) \cdots f(z_n) dz_1 \cdots dz_n \cdot (2\varepsilon)^{-n}.$$

Using the limit interchange allowed by the uniform boundedness of $\lambda(t)$ and $f(z)$, we reach $$\Lambda = \int_{-\infty}^{\infty} \cdots$$

$$\int_{-\infty}^{\infty} \lim_{\varepsilon \to 0} \Pr\{|X_1 + z_1 - t_1| < \varepsilon, \ldots, |X_n + z_n - t_n| < \varepsilon \,|\, Z_1 = z_1, \ldots,$$

$$Z_n = z_n\} \cdot (2\varepsilon)^{-n} f(z_1) \cdots f(z_n) dz_1 \cdots dz_n$$

Then, by the definition of the Likelihood function for the underlying NHPP, $$\Lambda = \int_{-\infty}^{\infty} \cdots \int_{-\infty}^{\infty} \lambda(t_1 - z_1) \cdots \lambda(t_n - z_n)$$

$$\exp\left(-\int_{-\infty}^{\infty} \lambda(u) du\right) f(z_1) \cdots f(z_n) dz_1 \cdots dz_n.$$

Finally, we rearrange $$\Lambda = \exp\left(-\int_{-\infty}^{\infty} \lambda(u) du\right) \prod_{i=1}^{n} \int_{-\infty}^{\infty} \lambda(t_i - z) f(z) dz$$

What is claimed is:

1. A system for extracting circuit parameters, the system comprising:
    an imaging photomultiplier configured to detect photons emitted from current-carrying channels in an integrated circuit, and configured to associate a detection position and a detection time with each detected photon;
    a data acquirer coupled to the imaging photomultiplier to receive signals indicative of detection position and detection time of detected photons, wherein the data acquirer is further configured to receive a trigger signal and configured to determine a relative detection time for each of the detected photons; and
    a processing module configured to receive data indicative of a photon intensity profile from the data acquirer, wherein the processing module is configured to maximize a likelihood equation to determine one or more parameters of the integrated circuit,
    wherein the processing module is further configured to determine a confidence region for one or more estimates of the integrated circuit parameter values.

2. The system of claim 1, wherein the likelihood equation is based on a Poisson Process with a time-dependent intensity profile.

3. The system of claim 2, wherein the time-dependent intensity profile comprises one or more triangular peaks.

4. The system of claim 3, wherein the one or more parameters include for each peak: a start time, a rise time, a height, and a fall time.

5. The system of claim 2, wherein the time-dependent intensity profile comprises one or more triangular peaks over a constant background intensity.

6. The system of claim 2, wherein the time-dependent intensity profile comprises one or more time-jittered peaks.

7. The system of claim 6, wherein the one or more parameters include a jitter variance for each peak.

8. An apparatus for extracting circuit parameters from photon detection data, the apparatus comprising:
    a storage module configured to store photon detection data; and a processing module coupled to the storage module to retrieve the photon detection data, wherein the processing module is configured to determine optimal parameters of a parameterized intensity model of the stored photon detection data,
    wherein the parameterized intensity model includes one or more triangular peaks.

9. The apparatus of claim 8, wherein the parameterized intensity model further includes a constant background intensity.

10. The apparatus of claim 8, wherein the processing module is further configured to determine confidence regions for one or more of said parameters.

11. An apparatus for extracting circuit parameters from photon detection data, the apparatus comprising:
    a storage module configured to store photon detection data; and
    a processing module coupled to the storage module to retrieve the photon detection data, wherein the processing module is configured to determine optimal parameters of a parameterized intensity model of the stored photon detection data,
    wherein the parameterized intensity model includes one or more time-jittered peaks.

12. The apparatus of claim 11, wherein the parameterized intensity model further includes a constant background intensity.

13. The apparatus of claim 11, wherein the processing module is further configured to determine confidence regions for one or more of said parameters.

14. A method of extracting circuit parameters from photon detection data, the method comprising:
    receiving photon detection data that shows variation with respect to time, wherein the photon detection data is indicative of one or more current flows in an integrated circuit device;
    determining optimal parameters of a parameterized Non-Homogeneous Poisson Process (NHPP) model for the photon detection data.

15. The method of claim 14, wherein the parameterized NHPP model includes a time-dependent intensity function having one or more triangular peaks.

16. The method of claim 14, wherein the parameterized NHPP model includes a time-dependent intensity function having one or more time-jittered peaks.

17. The method of claim 14, wherein the parameterized NHPP model includes a constant background intensity.

18. The method of claim 14, wherein the optimal parameters are those that maximize a likelihood function of the photon detection data.

19. The method of claim 14, further comprising:
    processing the photon detection data to remove background noise counts before said determining optimal parameters.

20. The method of claim 14, further comprising:
    determining a number of peaks in a time-dependent intensity function of the parameterized NHPP.

21. The method of claim 14, further comprising:
    finding a confidence Interval for one or more of the optimal parameters.

* * * * *

UNITED STATES PATENT AND TRADEMARK OFFICE
CERTIFICATE OF CORRECTION

PATENT NO. : 7,039,884 B2
APPLICATION NO. : 10/269609
DATED : May 2, 2006
INVENTOR(S) : John F. Kitchin It is certified that error appears in the above-identified patent and that said Letters Patent is hereby corrected as shown below:

In column 1, line 54, delete "modem" and insert -- modern --, therefor.

In column 6, line 64, delete "$g^3=g_1$" and insert -- $g_3=g_1$ --, therefor.

In column 8, line 63, delete "$T_1=X_i+Z_i$" and insert -- $T_i=X_i+Z_i$ --, therefor.

In column 10, line 63, delete "$(-\chi^2{}_{(1-\epsilon,k)}{}^2/2)$" and insert -- $(-\chi^2{}_{(1-\epsilon,k)}/2)$ --, therclbr.

In column 14, line 64, in Claim 21, delete "Interval" and insert -- interval --, therefor.

Signed and Sealed this

Twenty-eighth Day of July, 2009

JOHN DOLL
*Acting Director of the United States Patent and Trademark Office*